United States Patent [19]

Eggermont

[11] 4,231,101

[45] Oct. 28, 1980

[54] DIGITAL FILTER ARRANGEMENT FOR NON-UNIFORMLY QUANTIZED PCM

[75] Inventor: Ludwig D. J. Eggermont, Eindhoven, Netherlands

[73] Assignee: U.S. Philips Corporation, New York, N.Y.

[21] Appl. No.: 8,805

[22] Filed: Feb. 2, 1979

[30] Foreign Application Priority Data

Feb. 20, 1978 [NL] Netherlands ........................ 7801866

[51] Int. Cl.³ ............................................. G06F 15/31
[52] U.S. Cl. .................................. 364/724; 370/109; 375/26; 375/34
[58] Field of Search .......................... 364/724; 325/42; 340/347 DD; 179/15 AV

[56] References Cited

U.S. PATENT DOCUMENTS

| | | | |
|---|---|---|---|
| 3,752,970 | 8/1973 | Aaron et al. | 179/15 AV X |
| 3,766,546 | 10/1973 | Aaron et al. | 340/347 DD |
| 3,789,392 | 1/1974 | Candiani | 179/15 AV X |
| 3,988,606 | 10/1976 | Eggermont | 364/724 |
| 4,125,866 | 11/1978 | Van Essen et al. | 364/724 |
| 4,136,398 | 1/1979 | Eggermont | 364/724 |

*Primary Examiner*—Jerry Smith
*Attorney, Agent, or Firm*—Thomas A. Briody; William J. Streeter; Edward W. Goodman

[57] ABSTRACT

Digital filter for filtering non-uniformly quantised pulse code modulated signals formed by a sequence of code groups $x(i)$, each comprising a polarity bit, a segment number and a mantissa number. This digital filter arrangement comprises a generator which cyclically generates a series of sequentially occurring auxiliary numbers each comprising a polarity bit and an address code; a first storage medium 1 for storing the code groups $x(i)$ and controlled by an address computation circuit 13 to which the auxiliary numbers are applied; a second addressable storage medium 2 to which a segment number $s(i-h)$ a mantissa number $m(i-l)$, supplied by the first storage medium 1, as well as a polarity bit supplied by an exclusive OR-gate 3 are applied as the address code. This polarity bit is derived by gate 3 from the polarity bit $p(i-l)$ of the code groups $x(i)$ and the auxiliary numbers polarity bit. This second storage medium 2 contains positive numbers $z_p$ and negative numbers $z_n$ which represent the expanded values of all possible code groups $x(i)$. A positive number $z_p$ is read from the storage medium 2 if the polarity bit is positive and a negative number is the polarity bit is negative. The numbers read from the storage medium 2 are applied to an accumulator 4 which is coupled to an address code output of the generator 7.

6 Claims, 4 Drawing Figures

DIGITAL FILTER ARRANGEMENT FOR NON-UNIFORMLY QUANTIZED PCM

A. BACKGROUND OF THE INVENTION

A(1) Field of the Invention

The invention relates to a digital filter arrangement for filtering non-uniformly quantised pulse code modulated signals formed by a sequence of code groups $x(i)$, each comprising a polarity bit $p(i)$, a segment number $s(i)$ and a mantissa number $m(i)$.

A(2) Description of the Prior Art

As is known non-uniform pulse code modulation allows the conversion of information signals, which may vary over a wide dynamic range, into code groups, whose number of bits is smaller than the number of bits which is necessary when uniform pulse code modulation is used for coding a signal. The result is that when non-uniform pulse code modulation is used, the bit rate on the transmission path is lower than when uniform pulse code modulation is used and the signal-to-quantisation noise ratio is substantially constant over a considerable portion of the dynamic range.

A non-uniformly quantised pulse code-modulated signal is obtained by a non-linear processing of an information signal. This non-linear processing operation is known as compression. The characteristic indicating the relationship between the information signal and the non-uniformly pulse code modulated signal is called the compression characteristic. The 13-segment A-law and the 15-segment $\mu$ law are the most customary compression characteristics.

The segment number $s(i)$ in the code group $x(i)$ now indicates, in base-2 code, the segment number. This number $s(i)$ comprises $N_1$ bits, called the characteristic bits. If, for the compression, use is made of one of the above-mentioned compression characteristics then $N_1 = 3$ and the segment number equals $s_2 s_1 s_0$, wherein $s_o$ represents the least significant and $s_2$ the most significant bit, and wherein $s_j$ equals 1 or 0.

The mantissa number $m(i)$ in the code group $x(i)$ indicates, in base-2 code, the number of quantisation steps on the segment $s(i)$. This number $m(i)$ comprises $N_2$ bits, called the mantissa bits. If the above-mentioned compression characteristics are used, $N_2$ equals 4. The number $m(i)$ is now given by $e_3 e_2 e_1 e_0$. Herein it holds that $e_0$ is the least significant and $e_3$ the most significant bit and that $e_j$ has the value 1 or 0.

As is known (see, for example, reference 2), filtering a digital signal formed by a sequence of numbers $z(i)$ means that a sequence of numbers $y(i)$ must be determined, the relationship between $y(i)$ and $z(i)$ being given by the expression:

$$y(i) = \sum_{k=0}^{N-1} a(K) z(i - K) \quad (1)$$

if a nonrecursive digital filter is used. In (1), $a(k)$ represents a weighting factor, called the filter coefficient.

If a recursive digital filter is used to filter a digital signal, the relationship between $y(i)$ and $z(i)$ is given by the expression.

$$y(i) = \sum_{k=0}^{N-1} a(k) z(i-k) - \sum_{k=1}^{M} b(k) y(i-k) \quad (2)$$

In (2) $a(k)$ and $b(k)$ again represent filter coefficients.

If now a non-uniformly quantised pulse code-modulated signal is applied to the digital filter it will be necessary, in order to obtain a useful result, to convert this signal into a uniformly quantised pulse code-modulated signal formed by a sequence of numbers $z(i)$, each related in a manner still to be described (see also reference 1) to the numbers $s(i)$ and $m(i)$.

When designing a digital filter two parameters have an extremely important influence on the ultimate implementation; i.e. the required storage capacity and the maximum permissible internal processing rate.

For a non-recursive digital filter (see expression 1) the required storage capacity is determined by the value of N and the number of bits of the numbers $a(k)$ and $z(i)$. For a recursive digital filter (see expression (2)), the required storage capacity is, furthermore, determined by the value M and the number of bits of the numbers $b(k)$ and $y(i)$.

In general, a number $z(i)$ in the uniformly quantised pulse code modulated signal will comprise a greater number of bits than a code group $x(i)$ in the non-uniformly quantised code modulated signal. Therefore it is advantageous to store the code groups $x(i)$ (as described in reference 3) instead of the numbers $z(i)$.

The non-recursive digital filter, described in reference 3, for processing non-uniformly quantised pulse code modulated signals is constituted by a cascade arrangement of N storage sections, each arranged for storing and supplying a code group $x(i)$. The output of each of these storage sections is connected to a summing arrangement through a branch in which a storage medium is incorporated. The products of all possible values of $z(i)$ and the filter coefficients $a(k)$, characteristic of the relevant branch, are stored in each of these storage media. If it is assumed that the products stored in the storage media consist of thirteen bits, the storage capacity of each of these storage media must be $13 \times 2^8$, so that a total storage capacity of $8N + 13 \times 2^8 N$ is required in this digital filter.

The internal processing rate, is, for instance, determined by the number of bits of the numbers $a(k)$, $b(k)$, $z(i)$ and $y(i)$ and, particularly, by the time available for effecting a multiplication for determining the product $a(k) z(i-k)$ and the product $b(k) y(i-k)$.

The most frequently used method of binary multiplication of linear numbers is by accumulation, for which shifted versions of the multiplicand (for example $x(i-k)$) are applied to an accumulator, shifting of the multiplicand being determined by the digits of the multiplier (for example $a(k)$). The time required for performing a multiplication is determined by the number of times the multiplicand $x(i-k)$ must be applied to the accumulator and so by the number of digits of $a(k)$; furthermore, this period of time is determined by the time required by the accumulator to add a multiplicand applied thereto to the contents of the accumulator.

For a non-recursive digital filter (see expression (1)) the above means that if $a(k)$ and $z(i-k)$ are each for example, twelve-bit numbers, a total of approximately 12N shifting operations and 12N summing processes must be performed to determine one output signal sample $y(i)$.

In the non-recursive digital filter described in reference 3, the number of summing processes for each output signal sample is reduced to N by storing all the possible products of $a(k)$ and $z(i-k)$ in a storage medium. With this known device the number of summing processes for each output signal sample y(i) and, consequently, the internal processing rate is, indeed, particularly low; however, an enormous storage capacity is required, which is some hundreds of thousands of bits for normal values of N (for example N=100).

SUMMARY OF THE INVENTION

It is an object of the invention to provide a different concept of a digital filter arrangement for filtering non-uniformly quantised pulse code-modulated signals in which a considerably smaller storage capacity is sufficient with only a limited increase of the number of summing operations.

In accordance with the invention a digital filter arrangement therefore comprises:
- means for cyclically generating a series of consecutively occurring predetermined auxiliary numbers each of which is formed by a second polarity bit and an address code, said means comprising a second polarity output and an address code output;
- a first storage medium having addressable storage locations and being arranged for storing N consecutively occurring code groups x(i−k) wherein k=0, 1, 2, ... $N_1$ and i= ... −3, −2, −1, 0, 1, 2, 3, ..., which first storage medium comprises a storage location address input, an input for receiving said code groups x(i−k), a segment number output, a mantissa number output and a polarity bit output;
- means for coupling the address code output of the generating means to the storage location address input of the first storage medium;
- a second storage medium having a first and a second storage field, each addressable by means of a storage field address code, each storage field comprising storage locations addressable by means of storage location address codes, the second storage medium comprising a storage location address input, a storage field address input and an output;
- means for coupling the segment number and mantissa number output of the first storage medium to the storage location address input of the second storage medium;
- exclusive OR-gate means provided with inputs connected to the polarity bit output of the generating means and to that of the first storage medium, respectively, and comprising an output connected to the storage field address input of the second storage medium;
- accumulating means, operating in 1− or 2− complement, comprising an input coupled to the output of the second storage medium and means for shifting relative to one another, the number supplied by the second storage medium and the accumulating means contents, the shifting means being controlled by shift commands applied to the accumulating means through a shift command input;
- means for coupling the shift command input to the address code output of the generating means.

In a non-recursive digital filter the processes defined in (1) must be performed. Let us assume that:

$$a(k) = \text{sign}[a(k)] \, 'a(k)'$$

wherein sign $[a(k)]$ represents the sign and '$a(k)$' the magnitude of $a(k)$.

Let us assume in a corresponding manner that:

$$z(i-k) = \text{sign}[z(i-k)] \, 'z(i-k)'$$

(1) can now be written as:

$$y(i) = \sum_{k=0}^{N-1} \text{sign}[a(k)] \cdot \text{sign}[z(i-k)] \cdot |z(i-k)| \cdot |a(k)| \quad (3)$$

or:

$$y(i) = \sum_{k=0}^{N-1} \{p'(i-k) \cdot |z(i-k)|\} \cdot |a(k)|$$

wherein $p'(i-k) = \text{sign}[a(k)] \cdot \text{sign}[z(i-k)]$ and wherein sign $[z(i-k)]$ is equal to the sign of $x(i-k)$, so equal to $p(i-k)$.

The first storage field of the second storage medium now contains all possible positive values of z(i). These positive values will be indicated by $z_p$. The second storage field now contains all possible negative values of z(i), in either 1-complement or in 2-complement representation. The negative values, given in one of these two complement representations of z(i) will be indicated by $z_n$.

Whether a number $z_p$ or a number $z_n$ will be read from the second storage medium is now not determined by p(i), but by p'(i) which may be considered to be the product of the polarity p(i) of x(i) and the polarity sign $[a(k)]$ of the associated multiplicand a(k).

A storage capacity of $10^4$ bits, when N=100, will be sufficient for the non-recursive digital filter implemented in this manner.

When converting, in the manner extensively described in reference 4, each of the filter coefficients a(k) into a minimum number of multiplication factors f(k, j), the internal processing rate can be kept low. If the polarity of f(k, j) is represented by sign $[f(k, j)]$ and its magnitude by '$f(k, j)$' and if this magnitude is chosen so that it is exactly identical to $2^{F(k,j)}$ wherein F(k, j) represents an integer, the coding of the filter coefficients is such that $$a(k) = \sum_{j=1}^{Q} \text{sign}[f(k,j)] 2^{F(k,j)} \quad (4).$$

In practice, it appeared that, on the average, the value of Q does not exceed three. This means that in the digital filter using filter coefficients which are encoded in accordance with (4), a maximum number of 3 N shifting operations and 3 N summing operations needs to be performed. As described hereinafter, the use of a shifting accumulator (see reference 6) can reduce the number of shifting operations to a number approximately equal to the number of bits required to represent a filter coefficient a(k).

C. SHORT DESCRIPTION OF THE FIGURES

D. REFERENCES

Figure 1:
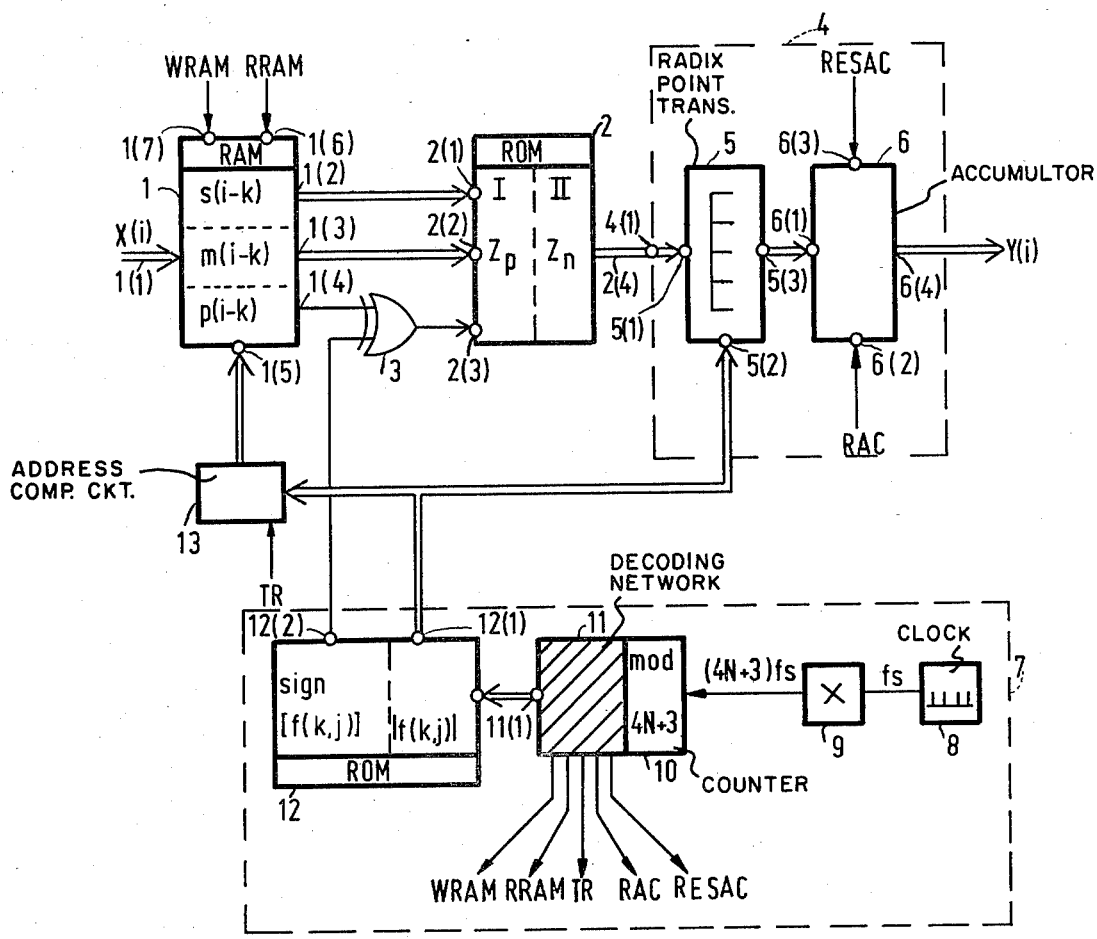
FIG. 1 shows a digital filter arrangement according to the invention.

1. A United Formulation of Segment Companding Laws and Synthesis of Codecs and Digital Companders; H. Kaneko; The Bell Systems Technical Journal, September 1970; pages 1555–1588.

2. Digital Signal Processing; A. V. Oppenheim, R. W. Schafer; Prentice-Hall Inc.

3. Stored Product Digital Filtering with Non-linear Quantization; O. Monkewich, W. Steenaart; Proceedings 1976 IEEE International Symposium on Circuits and Systems: pages 157–160.

4. U.S. Pat. No. 3,988,606.

5. Designer's Guide to: Digital Filters (part six); B. J. Leon, S. C. Bass; EDN, May 20, 1974; pages 61–68.

6. Arithmatic Operations in Digital Computers; R. K. Richards; D. van Nostrand Company, Inc.; page 143.

E. DESCRIPTION OF THE EMBODIMENTS

E(1). Theoretical basis

As mentioned in paragraph A(2) a non-uniformly quantised pulse code modulated signal applied to a digital filter must first be converted into a uniformly quantised pulse code-modulated signal in order to obtain a useful result. In what follows hereinafter, it is assumed that this uniformly quantised pulse code modulated signal is constituted by a sequence of numbers $z(i)$ each related in a manner, extensively described in reference 1, to the numbers $s(i)$ and $m(i)$.

Reference 1 contains an extensive theoretical treatise about the expansion of code groups $x(i)$ of non-uniformly quantised pulse code-modulated signals. From reference 1 it can be derived tha the practically applied A-law characteristic corresponds to the characteristic indicated in reference 1 by "A-law-DLA-midriser". In addition, it can be derived that the practically applied $\mu$-law characteristic corresponds to the characteristic indicated in reference 1 by "$\mu$-law-DLA-mid-tread". The following description will be limited to these two compression characteristics, although the invention is also directly applicable using other compression characteristics.

As appears from reference 1 it holds for the 13-segment A-law-DLA-mid-riser characteristic that:

$$\text{`}z(i)\text{'} = 2^{s(i)-\eta}\{m(i)+P\}-Q \qquad (5)$$

with:

$$s(i) = s_2 2^2 + s_1 2^1 + s_0 2^0 \qquad (6)$$

$$m(i) = e_3 2^3 + e_2 2^2 + e_1 2^1 + e_0 2^0 \qquad (7)$$

$$P = N \cdot \eta + 2^{-1}$$

$$Q = 0_{N_2}$$
$$N = 2$$

Herein $N_2$ represents the number of bits in $m(i)$, so that $N_2 = 4$. Furthermore, it holds that:

$$\eta = 0 \text{ for } s(i) = 0$$

$$\eta = 1 \text{ for } s(i) \neq 0$$

so that for $s(i) = 0$, it holds that:

$$\text{`}z(i)\text{'} = m(i) + 2^{-1}$$

$$\text{`}z(i)\text{'} = e_3 2^3 + e_2 2^2 + e_1 2^1 + e_0 2^0 + 2^{-1} \qquad (8)$$

and for $s(i) \neq 0$ it then holds that:

$$\text{`}z(i)\text{'} = 2^{s(i)-1}\{m(i)+2^4+2^{-1}\} \qquad (9)$$

For the 15-segments $\mu$-law-DLA-mid-tread it holds that:

$$\text{`}z(i)\text{'} = 2^{s(i)}\{m(i)+P\}-Q \qquad (10)$$

Herein $s(i)$ and $m(i)$ are given by (6) and (7) and it holds that:

$$P = Q = 2^{N_2} + 2^{-1}$$

so that:

$$\text{`}z(i)\text{'} = 2^{s(i)}\{2^4 + e_3 2^3 + e_2 2^2 + e_1 2^1 + e_0 2^0 + 2^{-1} - (2^4 + 2^{-1})\} \qquad (11)$$

$s(i)$ and $m(i)$ being given, it is thus possible to calculate, by means of (8) and (9) for the A-law and by means of (11) for the $\mu$-law, the associated value '$z(i)$'.

For the numbers $z_p$ and $z_n$ introduced in paragraph B, it now holds that:

$$z_p = +\text{`}z(i)\text{'}$$

$$z_n = -\text{`}z(i)\text{'}$$

where $z_n$ is prepresented either in 1-complement or in 2-complement representation.

E(2). The non-recursive digital filter arrangement

FIG. 1 shows an embodiment of a non-recursive digital filter arrangement for filtering non-uniformly quantised pulse code modulated signals formed by a sequence of code groups $x(i)$.

This filter arrangement comprises an input 1(1) to which the code groups $x(i)$ are applied. A first storage medium 1 (in this embodiment in the form of a RAM) is connected to this input 1(1) to store the N-code groups $x(i)$, $x(i-1)$, $x(i-2)$ ... $x(i=k)$, ..., $x(i-N+1)$, wherein $i = ... -3, -2, -1, 0, 1, 2, 3, 4, ...$ Each of these code groups $x(i-k)$, $k = 0, 1, 2, ... N = 1$ comprises, as remarked previously, a segment number $s(i-k)$, a mantissa number $m(i-k)$ and a polarity bit $p(i-k)$.

The storage medium 1 comprises three outputs indicated by 1(2), 1(3) and 1(4). In addition to the input 1(1), this storage medium 1 comprises an address input 1(5), a read command input 1(6) and a write command input 1(7). Code groups $x(i-k)$ can be written into and read out from, non-destructively, the storage medium 1 in a known manner (see for example reference 5). More particularly, a code grop is written into the storage medium 1 if a write command WRAM occurs at the write command input 1(7). The code group entered into the storage medium 1 is stored in the particular storage location allocated by an address code applied at the address input 1(5). If an address code is applied to the address input 1(5) and also a read command RRAM to the read command input 1(6), the code group stored in the storage location identified by the address code is read-out without being destroyed. From a code group $x(i-k)$ read from the storage medium 1, the segment number $s(i-k)$ is applied to the output 1(2), the associated mantissa number $m(i-k)$ is applied to the output 1(3) and the associated polarity bit $p(i-k)$ is applied to the output 1(4).

Furthermore, this filter arrangement comprises a second storage medium 2, implemented in this embodiment as a ROM. This storage medium comprises a first storage field, indicated by I, and a second storage field, indicated by II. The numbers $z_p$ are stored in the storage locations of the storage field I and the numbers $z_n$ are stored in the storage locations of the storage field II, in, for example, 2-complement representation.

This second storage medium 2 comprises storage location address inputs 2(1) and 2(2), a storage field address input 2(3), and an output 2(4). The address inputs 2(1) and 2(2) are connected respectively to the outputs 1(2) and 1(3) of the first storage medium 1. The address input 2(3) is connected to the output of an exclusive OR-gate 3, a first input of which is connected to the output 1(4) of the first storage medium 1.

The output 2(4) of the second storage medium 2 is connected to an input 4(1) of an accumulator 4, which, in this embodiment, includes a radix point translator 5, whose input 5(1) is connected to the output 2(4) of the second storage medium 2, via the input 4(1). This translator 5 also has a shift command input 5(2) and an output 5(3). The accumulator 4 further includes an accumulating device 6, operating in 2-complement and having an input 6(1) connected to the output 5(3) of the translator 5, as well as a read command input 6(2), a reset command input 6(3) and an output 6(4). Each time a read command RAC is applied to the input 6(2) the content of the device 6 is applied as an output signal sample y(i) to the output 6(4). If a reset command RESAC is applied to the input 6(3) the device 6 is reset to its zero position.

The arrangement described so far is controlled by a generator 7, which, in this embodiment comprises a clock generator 8 producing output pulses with a frequency $f_s$, which is equal to the frequency with which the code groups x(i) occur. These clock pulses are applied to a frequency multiplier 9 which furnishes a clock pulse signal within which the pulses occur with a frequency which, in this embodiment, is equal to $(4N+3)f_s$. Herein, N again represents the number of code groups stored in the first storage medium 1. The clock pulses furnished by the frequency multiplier 9 are applied to a modulo (4N+3) counter 10 which cycles through the counting positions 1 to 4N+3 inclusive. A decoding network 11 is connected to this counter 10. This network 11 has an output 11(1) connected to an address input of a store 12, which is in the form of a ROM. The counting positions 1 to 4N inclusive are directly applied through the decoding network 11, to the store 12, in response to which this store 12 produces, in a cyclic manner, a series of 4N auxiliary code words. In addition, this decoding network 11 also produces the command signals WRAM, FRAM, RAC, RESAC and a signal TR. More particularly, the signal RRAM has the logic value "1" at the counting positions 1 to 4N inclusive, the signal RAC has the logic value "1" at the counting position 4N+1, the signal RESAC has the logic value "1" at the counting position 4N+2 and at the counting position 4N+3 the signal TR as well as the signal WRAM both have the logic value "1".

The store 12 has outputs 12(1) and 12(2). In this embodiment the output 12(1) is directly connected to the shift command input 5(2) of the radix point translator 5 and also to an input of an address computation circuit 13. The signal TR is also applied to this circuit 13, which has an address code output connected to the address input 1(5) of the first storage medium 1.

Figure 2:
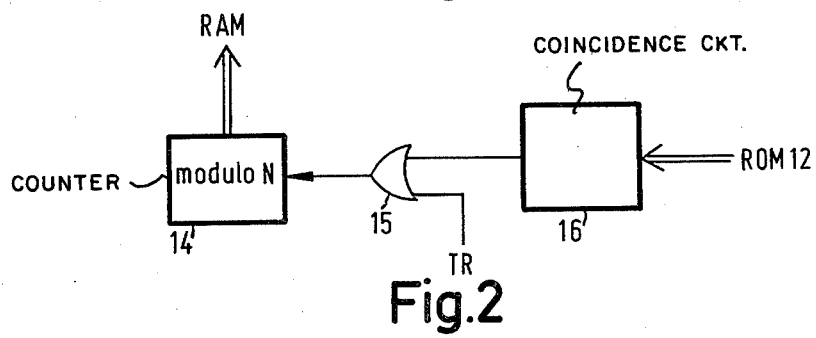
FIG. 2 shows an address calculating circuit for use in the arrangement of FIG. 1.

The address computation circuit 13 may be implemented in the manner shown in FIG. 2, in which event it comprises a modulo-N-counter 14 producing the address codes for the first storage medium 1 and, counting pulses, produced by an OR-gate 15, are applied to it. The signal TR as well as the output signal of a coincidence circuit 16, whose input is connected to the output 12 (1) of the store 12, is applied to this OR-gate 15.

In the arrangement shown in FIG. 1, the output 12(2) of the store 12 is furthermore connected to a second input of the exclusive OR-gate 3.

In this embodiment it is assumed that each of the required filter coefficients a(k) is characterized, in the manner indicated in expression (4), by a number of multiplication factors f(k, j). Let it be assumed that, for example, $a(k) = +000111 (= +7)$. This filter coefficient can now be represented by the multiplication factors $f(k, 1) = +01000 (= +2^3)$ and $f(k, 2) = 000001 = (-2^0)$. A filter coefficient $a(k) = +011101 (= +29)$ can be represented by the multiplication factors $f(k, 1) = +100000 (= +2^5)$, $f(k, 2) = -000100 (= -2^2)$ and $f(k, 3) = +000001 (= +2^0)$. The required multiplication factors f(k, j) are now stored in the store 12 in such a way that the multiplication factors, characterizing a certain filter coefficient, appear consecutively at the outputs 12(1) and 12(2) of the store 12, the magnitude 'f(k, j)' appearing at the output 12(1) and the sign 'f(k, j)' at the output 12(2).

As the number of multiplication factors f(k, j), which together characterize a given filter coefficient a(k), will differ from coefficient to coefficient, stop numbers are also stored in the store 12, in such a manner that, each time a group of multiplication factors f(k, j), which together characterize a given filter coefficient a(k), have been read from the store 12, a stop number occurs. This stop number is detected by the coincidence circuit 16 which, in response thereto, applies a counting pulse to the counter 14 which, in response thereto, shifts one counting position further in its cycle. The latter also occurs if a TR-pulse occurs.

In response to the two polarity bits p(i) and sign [f(k, j)] applied thereto, the exclusive OR-gate 3 produces a polarity bit p'(i). If the polarity of a positive number is assumed to be equal to the logic value "0" and the polarity of a negative number to the logic value "1", then p'(i) = "0" if p(i) and sign [f(k, j)] are equal (so both equal "1" or both equal "0"). If, on the contrary, p(i) is not equal to sign [f(k, j)] then p'(i) = "1".

The code group, formed by the segment number s(i), the mantissa number m(i) and the polarity bit p'(i), produced by the exclusive OR-gate 3, is applied as an address code to the storage medium 2. If p'(i) = "0" a number $z_p$ is read from the storage field I and applied to the radix point translator 5, which produces a number corresponding to the product $z_p \cdot$ 'f(k, j)', which is applied to the 2-complement accumulating device 6. If p'(i) = "1", a number $z_n$ is read from the storage field II and also applied to the radix point translator 5.

It should be noted that, instead of the multiplication factors f(k, j), the numbers F(k, j) (see expression (4)) may be stored in the store 12. In this case, it will be necessary to include, between the output 12 (1) of the store 12 and the input 5(2) of the radix point translator 5, an encoding network which converts each number F(k, j) into a number $2^{F(k, j)} =$ 'f(k, j)'.

It should also be noted that, although the bits of the numbers such as s(i), m(i), may be produced in series as well as in parallel, it is assumed in the embodiment shown in the FIGS. 1 and 2 that the bits of all multi-bit numbers are produced in parallel. To this end those connections in FIGS. 1 and 2 at which multi-bit numbers occur are indicated by the arrow symbol →. This symbol will also be used in the other Figures where appropriate.

E(3). The preferred embodiment

Figure 3:
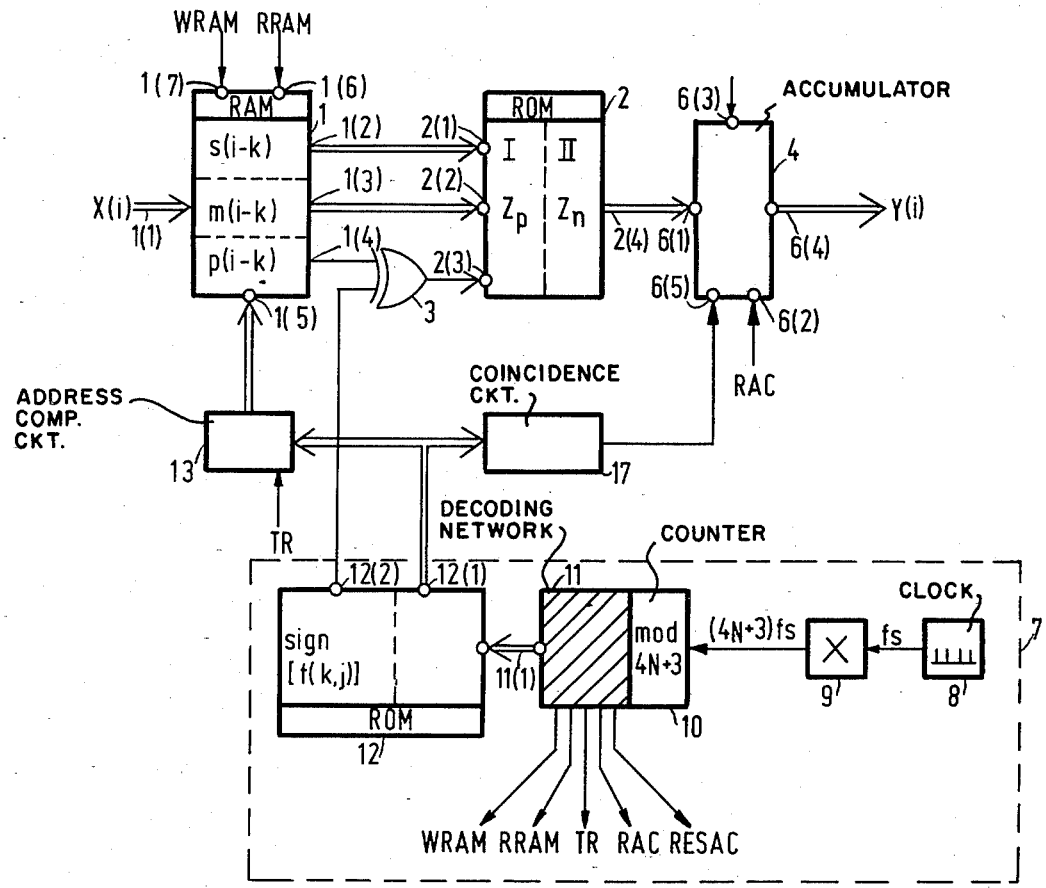
FIG. 3 shows a preferred embodiment of a digital filter arrangement according to the invention, comprising a shifting accumulator.

The embodiment shown in FIG. 1 contains all possible values 'f(k, j)' with which a number, supplied by the second storage medium 2, must be multiplied. By storing in the store 12 the address codes of those numbers in the first storage medium 1 which must be multiplied by a given multiplication factor 'f(k, j)' instead of these values f(k, j) or the numbers F(k, j) equivalent thereto, the accumulator 4 can be implemented as a shifting accumulator. An embodiment based on this principle is shown in FIG. 3. The non-recursive digital filter arrangement shown in FIG. 3 differs from the arrangement shown in FIG. 1 in the following respects.

Figure 4:
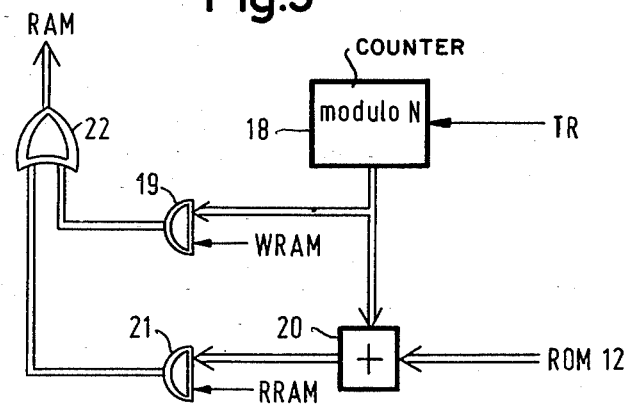
FIG. 4 shows an address calculating circuit for use in the arrangement of FIG. 3.

The radix point translator 5 which was required in the arrangement of FIG. 1 can be dispensed with in the arrangement shown in FIG. 3. Its function is obtained by using the shifting accumulator 4 (see reference 6) which comprises a shift pulse input 6(5). This shift pulse input 6(5) is connected through a coincidence circuit 17 to the output 12(1) of the store 12. An address computation circuit 13, connected by means of an input to the output 12(1) of the store 12 and by means of an output to the address input of the first storage medium 1 is also used in the arrangement shown in FIG. 3. This address computation circuit 13 is implemented in the way shown in FIG. 4. The address computation circuit 13 shown in FIG. 4 comprises a modulo-N-counter 18 to which the TR pulses are applied as counting pulses. The counting position of this counter 18 is applied to an AND-gate circuit 19, to which also the WRAM-pulses are applied. The counting position of the counter 18 is also applied to a modulo-N-adder 20, the input of which is connected to the output 12(1) of the store 12. The output of this adder 20 is connected to the input of an AND-gate circuit 21 to which also the RRAM signal is applied. The outputs of these AND-gate circuits 19 and 21 are connected to inputs of an OR-gate circuit 22, the output of which is connected to the address input 1(5) of the first storage medium 1. Each time a WRAM-pulse is produced, the position of the counter 18 is applied as the address code to the first storage medium 1 and each time RRAM="1" the number produced by the adder 20 is applied as an address code to the address input of the first storage medium 1.

The store 12 again produces cyclically a series of 4N auxiliary code words which are now not only formed by stop numbers but also by address codes which are applied, modified or not modified by the address computation circuit 13, to the address input 1(5) of the first storage medium 1. More particularly, each stop number is now detected by the coincidence circuit 17, which in response thereto applies a shift pulse to the accumulator 4, which is set thereby to a position which is one place higher than its preceding position. If, for example, the accumulator 4 was in a position corresponding to a multiplication of the numbers, applied through the input 6(1), by $2^n$, where n represents an integer, the setting of the accumulator 4 becomes such, in response to the next stop number, that it corresponds to a multiplication of the numbers applied thereto by a factor $2^{n+1}$. Only if the accumulator 4 is in the highest position, is it adjusted to the lowest position ($2^0$) in response to a next stop number. A number of address codes now occur between, each time, two consecutive stop numbers, in response to which the code groups, whose expanded values must be multiplied by a value corresponding to the setting of the accumulator 4 achieved by the occurrence of the last stop number, occur at the output of the first storage medium 1.

What is claimed is:

1. Digital filter arrangement for filtering non-uniformly quantised pulse code-modulated signals formed by a sequence of code groups x(i), each comprising a polarity bit p(i), a segment number s(i) and a mantissa number m(i), wherein this arrangement comprises:

means for cyclically generating a series of consecutively occurring predetermined auxiliary code words each of which is formed by a second polarity bit and an address code, said means comprising a second polarity bit output and an address code output;

a first storage medium having addressable storage locations and being arranged for storing N consecutively occurring code groups x(i−k) where in k=0, 1, 2, ... N−1 and i=... −3, −2, −1, 0, 1, 2, 3, ..., which first storage medium comprises a storage location address input, an input for receiving said code groups x(i−k), a segment number output, a mantissa number output and a polarity bit output;

means for coupling the address code output of the generating means to the storage location address input of the first storage medium;

a second storage medium having a first and a second storage field, each addressable by means of a storage field address code, each storage field comprising storage locations which are addressable by means of storage location address codes, the second storage medium comprising storage location address inputs, a storage field address input and an output;

means for coupling the segment number and mantissa number outputs of the first storage medium to the respective storage location address inputs of the second storage medium;

exclusive OR-gate means comprising inputs connected to the polarity bit output of the generating means and the first storage medium, respectively, and comprising an output connected to the storage field address input of the second storage medium;

accumulating means, operating in 1- or 2-complement, comprising an input coupled to the output of the second storage medium and means for shifting, relative to one another, the number supplied by the second storage medium and the accumulating means content, the shifting means being controlled by shift commands applied to the accumulating means through a shift command input; and means for coupling the shift command input to the address code output of the generating means.

2. A digital filter arrangement as claimed in claim 1, wherein said generating means comprises a clock generator having a pulse output frequency $f_s$ equal to the frequency at which the code groups x(i) occur; a frequency multiplier coupled to the output of the clock generator for supplying an output frequency equal to $(4N+3) f_s$, wherein N represents the number of code groups stored in the first storage medium; a modulo-$(4N+3)$-counter coupled to said frequency multiplier for cycling through the counting positions 1 to $(4N+3)$ inclusive; a decoding network coupled to said modulo- (4N+3)-counter for producing command signals for said first storage medium, said accumulating means and said means for coupling the address code output of the generating means to the storage location address input of the first storage medium; and a store coupled to said decoding network, wherein said decoding metwork is arranged to directly apply to said store the counting position 1 to 4N inclusive and said store being arranged to cyclically produce, in response to said counting position, 4N auxiliary code words, each formed by a second polarity bit and an address code.

3. A digital filter arrangement as claimed in claim 1 or 2, wherein said means for coupling the address code output of said generating means to the storage location address input of the first storage medium is an address computation circuit which comprises a coincidence circuit coupled to the address code output of said generating means for generating a pulse at the end of each address code received from said generating means; an OR-gate having a first and a second input and an output, said first input being coupled to the output of said coincidence circuit and said second input coupled to said generating means for receiving a command signal; and a modulo-N-counter to the output of said OR-gate for producing the address codes for said first storage medium.

4. A digital filter arrangement as claimed in claims 1 or 2, wherein said means for coupling the address code outputs of said generating means to the storage location address input of the first storage medium is an address computation circuit which comprises a modulo-N-counter for receiving command signals from said generating means; a first AND-gate circuit having a first input coupled to said modulo-N-counter and a second input arranged to receive command signals from said generating means; a modulo-N-adder having a first input coupled to said modulo-N-counter and a second input coupled to said address code output of said generating means; a second AND-gate circuit having a first input coupled to the output of said modulo-N-adder and a second input arranged to receive command signals from said generating means; and an OR-gate circuit coupled to said first and said second AND-gate circuits for providing the address codes for said first storage medium.

5. A digital filter arrangement as claimed in claim 4, wherein said means for coupling the shift command input to the address code output of said generating means comprises a coincidence circuit.

6. A digital filter arrangement as claimed in claim 1, wherein said means for coupling the shift command input to the address code output of said generating means comprises a coincidence circuit.

* * * * *